United States Patent

Nonaka (10) Patent No.: US 12,228,951 B2
(45) Date of Patent: Feb. 18, 2025

(54) VACUUM EXHAUST SYSTEM

(71) Applicant: Edwards Japan Limited, Yachiyo (JP)

(72) Inventor: Manabu Nonaka, Yachiyo (JP)

(73) Assignee: Edwards Japan Limited, Yachiyo (JP)

( * ) Notice: Subject to any disclaimer, the term of this patent is extended or adjusted under 35 U.S.C. 154(b) by 0 days.

(21) Appl. No.: 18/245,080

(22) PCT Filed: Oct. 1, 2021

(86) PCT No.: PCT/JP2021/036490
§ 371 (c)(1),
(2) Date: Mar. 13, 2023

(87) PCT Pub. No.: WO2022/075230
PCT Pub. Date: Apr. 14, 2022

(65) Prior Publication Data
US 2023/0400868 A1 Dec. 14, 2023

(30) Foreign Application Priority Data
Oct. 6, 2020 (JP) .................. 2020-169296

(51) Int. Cl.
*G05D 7/06* (2006.01)
*H01L 21/67* (2006.01)

(52) U.S. Cl.
CPC ...... *G05D 7/0688* (2013.01); *H01L 21/67017* (2013.01)

(58) Field of Classification Search
CPC .................................. G05D 7/0688
See application file for complete search history.

(56) References Cited

U.S. PATENT DOCUMENTS 4,850,806 A 7/1989 Morgan et al.
5,259,735 A * 11/1993 Takahashi ............... B01J 3/006
417/205

(Continued)

FOREIGN PATENT DOCUMENTS

EP 0343914 B1 3/1994
JP H0242186 A 2/1990

(Continued)

OTHER PUBLICATIONS

International Search Report and Written Opinion of International Application No. PCT/JP2021/036490 dated Nov. 30, 2021, 9 pp.

(Continued)

*Primary Examiner* — Kevin R Barss
(74) *Attorney, Agent, or Firm* — Shumaker & Sieffert, P.A.

(57) ABSTRACT

A vacuum exhaust system is provided which can reduce a size of a pump or a valve, and can thin the pipe diameter, and can perform highly efficient exhaust making the best use of exhaust characteristics of the pump from high vacuum to the large flow region. The process gas used in a vacuum chamber passes through a regulating valve, and reaches a first branch pipe. The passage on the side indicated with A in the drawing of the first branch pipe is connected with an inlet port of a second pump. On the other hand, the passage indicated with B in the drawing of the first branch pipe is provided with a bypass valve. Then, the downstream of an outlet port of the second pump and the downstream of the bypass valve are connected with a first pump via a second branch pipe. In the low and medium vacuum regions (at the time of large flow rate exhaust), the bypass valve is opened. At this time, the gas is exhausted through both the passage A including the second pump therethrough and a passage B. Then, when exhaust under medium and high vacuum conditions lower than that is performed, the bypass valve is (Continued)

closed, thereby performing exhaust through the passage A. As a result of this, the pipe of the passage B can be thinned.

5 Claims, 6 Drawing Sheets

(56) References Cited

U.S. PATENT DOCUMENTS

| | | | |
|---|---|---|---|
| 5,704,214 A * | 1/1998 | Fujikawa | B01D 8/00 |
| | | | 62/55.5 |
| 6,200,107 B1 | 3/2001 | Brewster | |
| 6,446,651 B1 | 9/2002 | Abbel | |
| 2006/0175012 A1 | 8/2006 | Lee | |
| 2008/0006346 A1 * | 1/2008 | Sato | C21D 1/773 |
| | | | 266/250 |
| 2012/0288625 A1 * | 11/2012 | Furuya | H01L 21/67115 |
| | | | 118/725 |
| 2018/0082819 A1 * | 3/2018 | Ebine | H01J 37/16 |

FOREIGN PATENT DOCUMENTS

| | | |
|---|---|---|
| JP | H03164581 A | 7/1991 |
| JP | H04326943 A | 11/1992 |
| JP | H11153087 A | 6/1999 |
| WO | 2019058117 A1 | 3/2019 |

OTHER PUBLICATIONS

Extended Search Report from counterpart European Application No. 21877529.4 dated Oct. 1, 2024, 9 pp.

Notification of Reason for Refusal, and translation thereof, from counterpart Japanese Application No. 2020-169296 dated Oct. 11, 2024, 8 pp.

* cited by examiner

VACUUM EXHAUST SYSTEM

This application is a U.S. national phase application under 35 U.S.C. § 371 of international application number PCT/JP2021/036490 filed on Oct. 1, 2021, which claims the benefit of JP application number 2020-169296 filed on Oct. 6, 2020. The entire contents of each of international application number PCT/JP2021/036490 and JP application number 2020-169296 are incorporated herein by reference.

TECHNICAL FIELD

The present disclosure relates to a vacuum exhaust system, and more particularly, relates to a vacuum exhaust system capable of reducing the size of a pump or a valve, and thinning a pipe diameter, and capable of performing highly efficient exhaust making the best use of exhaust characteristics of pumps from high vacuum to the large flow rate region.

BACKGROUND

With recent development of electronics, demand for semiconductors such as a memory and an integrated circuit has been rapidly increasing. The semiconductors are manufactured, for instance, by doping a semiconductor substrate having a very high purity with impurities, and thereby imparting electric properties thereto, forming microscopic circuit patterns on semiconductor substrates, and stacking them.

Then, such operations may be performed in a vacuum chamber in a high vacuum state in order to avoid effects elicited from dust in air, or the like. For exhaust from the vacuum chamber, generally a vacuum exhaust system, to which a pump device including a volume transfer type vacuum pump or a momentum transfer type vacuum pump is applied, has been used.

Further, manufacturing steps of a semiconductor include a large number of steps of causing various process gases to act on a semiconductor substrate. The vacuum exhaust system is used not only for evacuating inside of the vacuum chamber, but also for exhausting the process gases from the inside of the vacuum chamber. Further, the vacuum exhaust system is also used in an electron microscope facility so that environment in the vacuum chamber of an electron microscope or the like is at a high level vacuum state in order to prevent refraction or the like of an electron beam caused by the presence of powder dust, or the like.

SUMMARY

Figure 3:
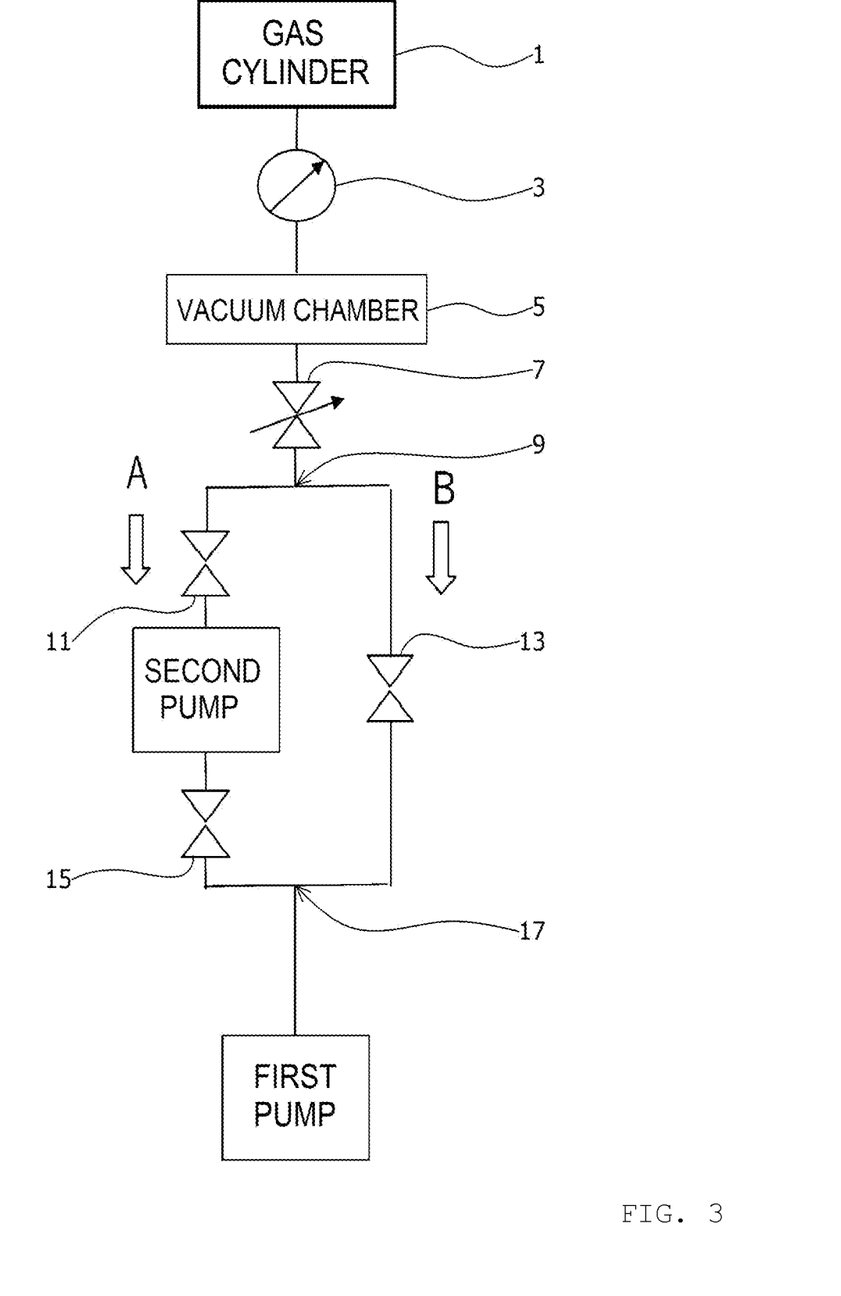
FIG. 3 is a block view of a conventional vacuum exhaust system (part 1).

FIG. 3 shows a block view of an example vacuum exhaust system. In FIG. 3, a flow rate of process gas supplied from a gas cylinder 1 is adjusted at a gas flow rate controller 3, and then is charged into a vacuum chamber 5. Thereafter, the process gas that has been used in the vacuum chamber 5 is discharged from the vacuum chamber 5, passes through a regulating valve 7 for regulating the gas flow rate, and reaches a branch pipe 9. The passage on the side indicated with A in the drawing of the branch pipe 9 is connected with an inlet port, which is not shown, of a second pump via a passage switching valve 11. On the other hand, the passage on the side indicated with B in the drawing of the branch pipe 9 is provided with a passage switching valve 13.

Then, the outlet port not shown of the second pump is provided with a passage switching valve 15. A first pump is connected to the downstream of the passage switching valve 15 and the downstream of the passage switching valve 13 via a branch pipe 17.

A description will be given to the case requiring, in such a configuration, both of conditions of a process in low and medium vacuum regions with a high gas flow rate, and a process in medium and high vacuum regions requiring a lower pressure condition than in the former process, as conditions of processes to be performed in the vacuum chamber 5.

In this case, conventionally, with the process in the low and medium vacuum regions with a high gas flow rate, the passage switching valve 11 and the passage switching valve 15 are closed, and the passage switching valve 13 is opened, thereby performing exhaust via the passage B. On the other hand, with the process in the medium and high vacuum regions requiring a lower pressure condition than in the former process, switching is performed so that the passage switching valve 13 is closed, and the passage switching valve 11 and the passage switching valve 15 are opened, thereby performing exhaust via the passage A.

Incidentally, in the vacuum exhaust system, reduction of the pressure of the vacuum chamber 5 at the time of large flow rate exhaust may benefit from an increase in aperture of the pipe of the passage B or the passage switching valve 13. For this reason, the vacuum exhaust system increases in size, which may result in a difficulty in ensuring a setting space, or an increase in cost.

Figure 4:
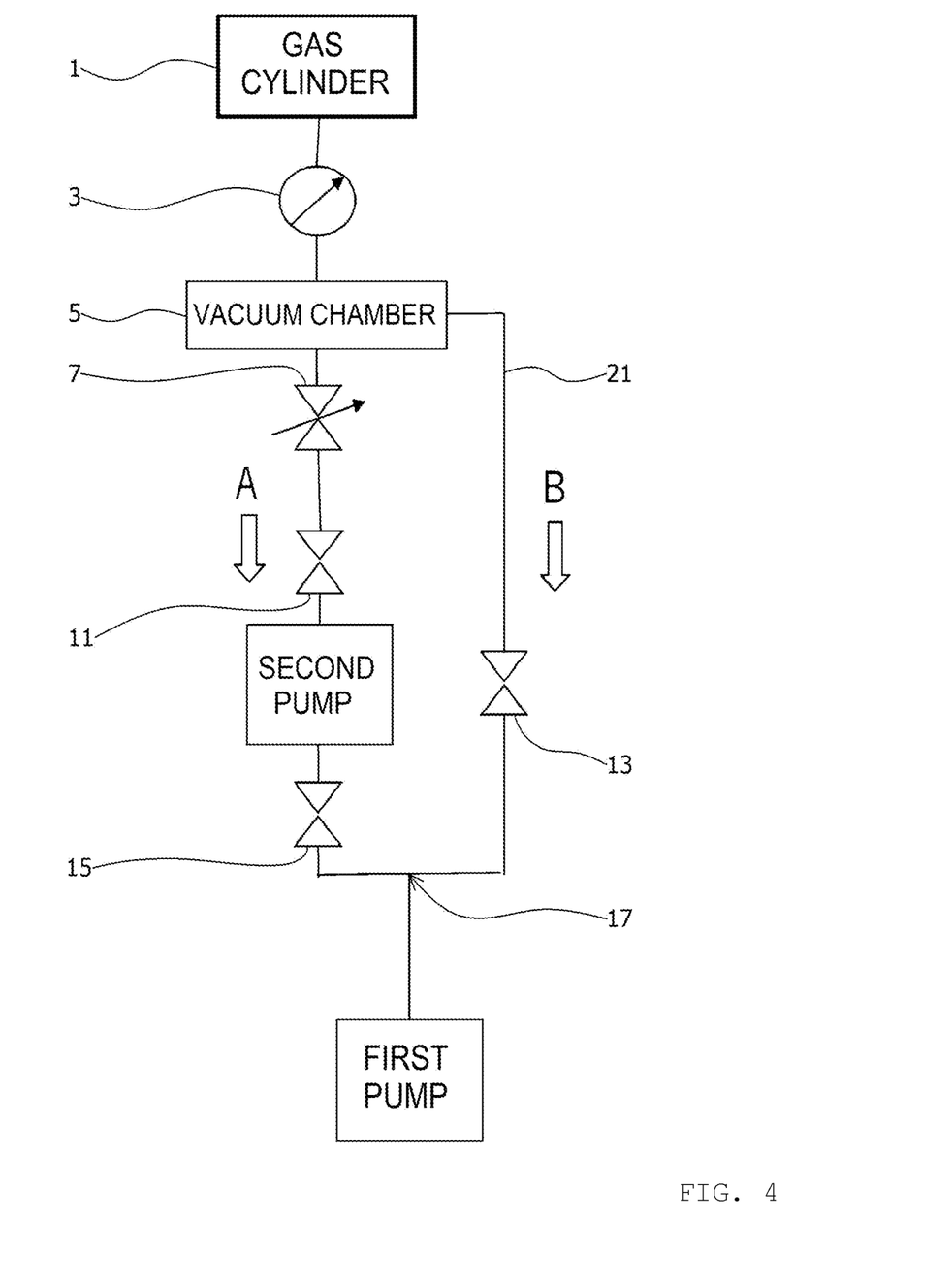
FIG. 4 is a block view of a conventional vacuum exhaust system (part 2).

Further, when the process gas to be discharged from the vacuum chamber 5 is discharged at a large flow rate, as shown in FIG. 4 a bypass pipe 21 may be directly connected with the vacuum chamber 5. However, as with the foregoing description, the vacuum exhaust system may increase in size, which may result in difficulty in ensuring a setting space, or an increase in cost. Incidentally, in FIG. 4, same elements as those in FIG. 3 are given same reference numerals and signs, and will not be described (the same shall apply hereinafter).

Figure 5:
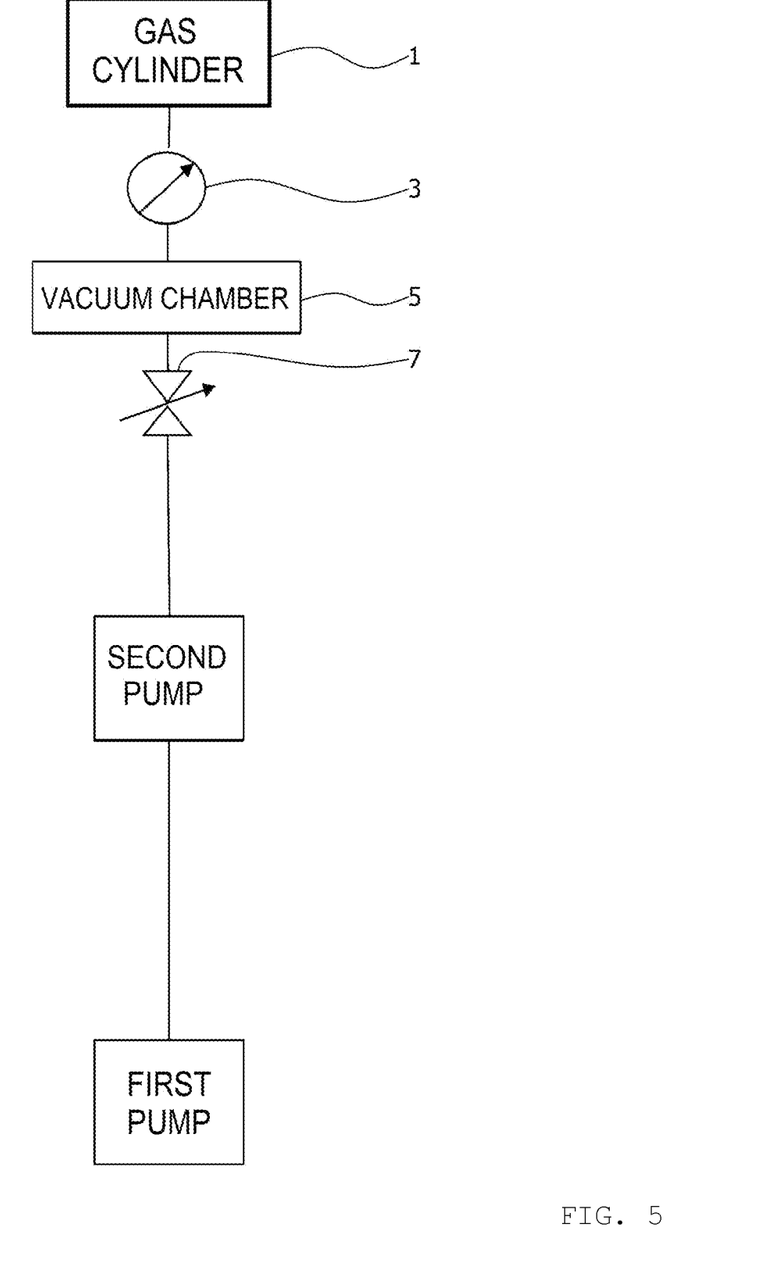
FIG. 5 is a block view of a conventional vacuum exhaust system (part 3).

Further, FIG. 5 shows an example in which the second pump can be operated even in the medium vacuum region, and the second pump is connected in series with a first pump.

Figure 6:
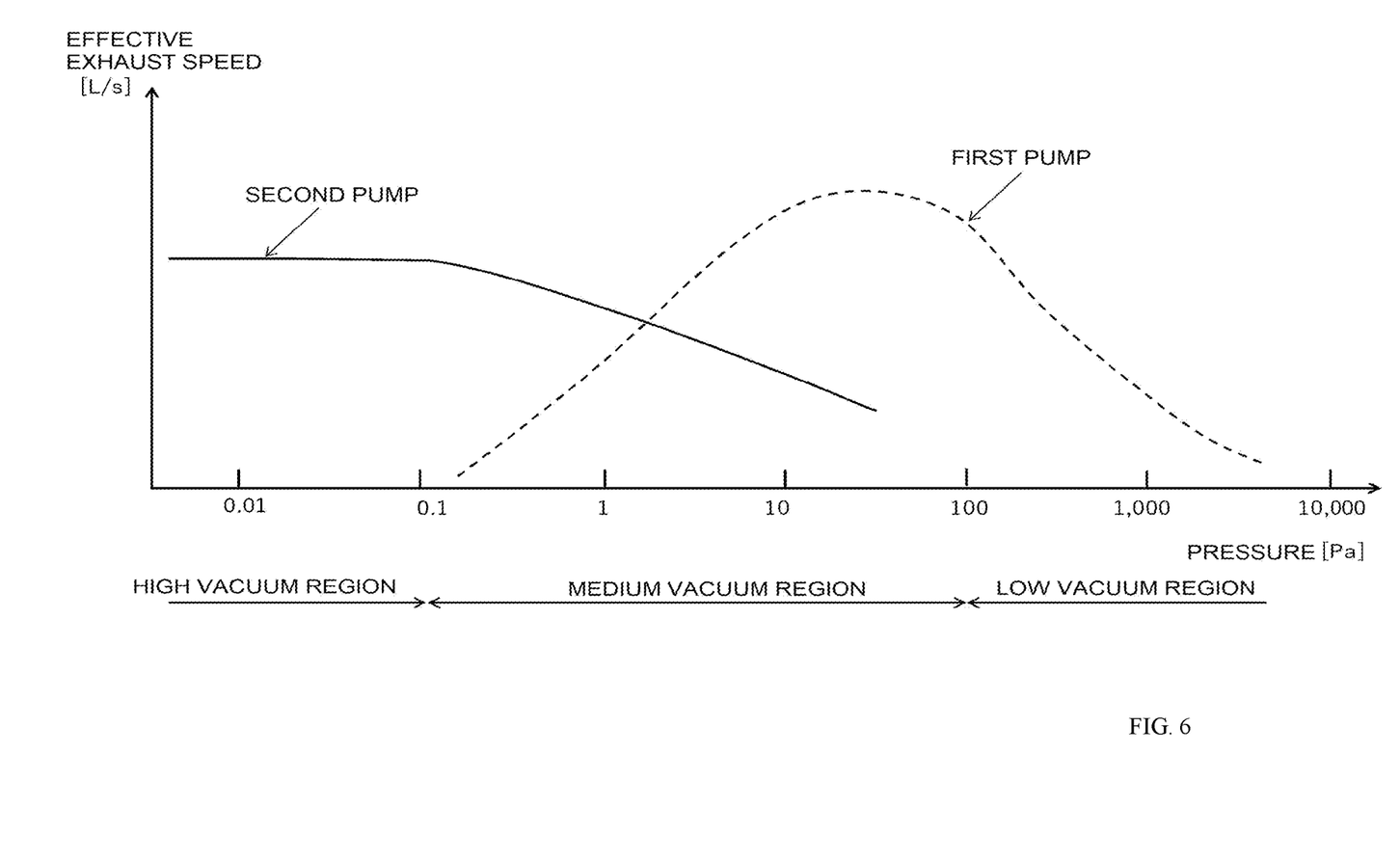
FIG. 6 is a view showing the manner in which the exhaust characteristic of the second pump decreases in the medium vacuum region.

However, in this case, the exhaust efficiency of the second pump may be reduced in the medium vacuum region, which may result in a decrease in exhaust performance of the system. FIG. 6 shows a manner in which an exhaust characteristic of the second pump decreases in the medium vacuum region. Namely, it is indicated that, for the second pump, an effective pumping speed gradually decreases in conjunction with an increase in pressure in the medium vacuum region having a higher pressure than 0.1 [Pa].

For compensation for the above an increase in size of the second pump, or an increase in size of the pipe or valve may be helpful, resulting in an increase in size of the vacuum exhaust system. For this reason, as with the foregoing description, it may become difficult to ensure a setting space, or a higher cost may be incurred.

The present disclosure was completed in view of such considerations. It is an object of the present disclosure to provide a vacuum exhaust system capable of reducing the size of a pump or a valve, and capable of thinning a pipe diameter, and capable of performing highly efficient exhaust making the best use of exhaust characteristics of pumps from high vacuum to a large flow rate region.

For this reason, in accordance with the present disclosure (first aspect), a vacuum exhaust system includes a first pump for performing vacuum exhaust from atmospheric pressure to a medium vacuum region; a second pump connected in series with the first pump, and having a lower ultimate pressure than that of the first pump; and a bypass valve provided in parallel with the second pump via a pipe communicating with an inlet port and an outlet port of the second pump, wherein an exhaust gas from a vacuum chamber is exhausted via bot of a passage of the second pump and a passage of the bypass valve.

An exhaust gas from the vacuum chamber is exhausted via both of the passage of the second pump and the passage of the bypass valve in addition to the suction of the first pump. As a result of this, as compared with the case where suction is performed by switching between the passage of the second pump and the passage of the bypass valve, or the case where suction is performed by connecting the first pump and the second pump in series with each other, with this vacuum exhaust system, it becomes possible to perform vacuum exhaust making the best use of the exhaust characteristics of both of the second pump and the first pump without increasing the size of the second pump. The bypass valve and the pipe diameter can also be configured small.

Further, in accordance with the present disclosure (second aspect), in a low medium vacuum region, while the first pump and the second pump being operated, the bypass valve is opened, and in medium and high vacuum regions, while the first pump and the second pump being operated, the bypass valve is closed.

As a result of this, it is possible to reduce the sizes of the second pump, the bypass valve, and the pipe diameter. In addition, it becomes possible to perform highly efficient exhaust making the best use of the exhaust characteristics of the first pump and the second pump in from high vacuum to the large flow region.

Further, in accordance with the present disclosure (third aspect), the vacuum exhaust system includes a flow rate measuring means for measuring the flow rate of the exhaust gas flowing in the vacuum chamber; and an opening/closing control means for opening or closing the bypass valve on the basis of the magnitude of the flow rate measured by the flow rate measuring means.

The bypass valve is opened or closed on the basis of the magnitude of the flow rate measured by the flow rate measuring means. As a result of this, control can be performed with efficiency by switching between the time when the flow rate of the exhaust gas flowing in the vacuum chamber is a large flow rate and the time of a small flow rate (or a gas flow rate of zero) requiring high vacuum in the vacuum chamber.

Further, in accordance with the present disclosure (fourth aspect), the vacuum exhaust system includes an opening degree control means for controlling the degree of opening of the bypass valve, wherein the degree of opening is controlled by the opening degree control means according to at least any one of the flow rate of the exhaust gas flowing in the vacuum chamber and the pressure in an exhaust system.

By controlling the degree of opening of the bypass valve, it becomes possible to reduce the pressure load applied to the pump, which enables the stable operation of the pump. Further, it is possible to prevent a fluctuation in process conditions due to the pulsation of exhaust, and the misregistration due to fluctuations in pressure or vibration of the object to be processed in the vacuum chamber.

Further, in accordance with the present disclosure (fifth aspect), the first pump includes a volume transfer type vacuum pump having a large pumping speed in the medium vacuum region.

Furthermore, in accordance with the present disclosure (sixth aspect), the second pump includes a momentum transfer type vacuum pump having a high pumping speed in a high vacuum region, and having an ultimate pressure reaching high vacuum or a lower pressure than the high vacuum.

As described up to this point, in accordance with the present disclosure, it is configured such that the exhaust gas from the vacuum chamber is exhausted via both of the passage of the second pump and the passage of the bypass valve in addition to the suction of the first pump. For this reason, with the vacuum exhaust system, it becomes possible to perform vacuum exhaust making the best use of the exhaust characteristics of both of the second pump and the first pump without increasing the size of the second pump. The bypass valve and the pipe diameter can also be configured small.

DETAILED DESCRIPTION

Figure 1:
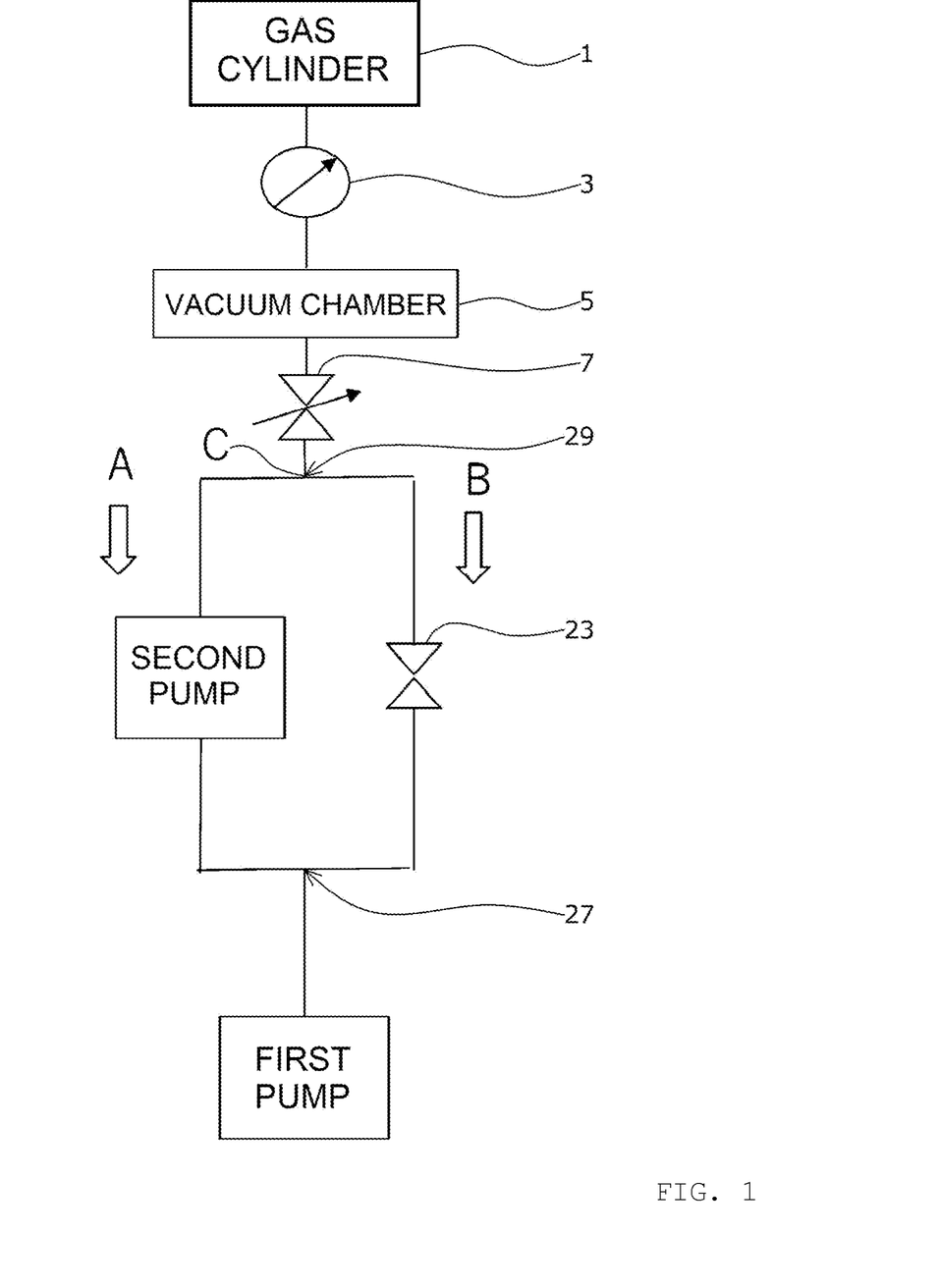
FIG. 1 is a block view of a vacuum exhaust system of an example of the present disclosure.

Below, examples of the present disclosure will be described. FIG. 1 shows a block view of a vacuum exhaust system of an example of the present disclosure.

In FIG. 1, the process gas which has been used in a vacuum chamber 5 passes through a regulating valve 7, and reaches a branch pipe 29. The passage on the side indicated with A in the drawing of a branch pipe 29 is connected with an inlet port not shown of a second pump. On the other hand, the passage on the side indicated with B in the drawing of the branch pipe 29 is provided with a bypass valve 23.

Then, the downstream of the outlet port not shown of the second pump and the downstream of the bypass valve 23 are connected with a first pump via a branch pipe 27.

With such a configuration, as the first pump, for example, a volume transfer type vacuum pump of a root type, a screw type, a claw type, or the like is used. As the characteristics of the first pump, a pump with a high pumping speed in the medium vacuum region, and suitable for exhaust of a large flow rate gas is desirable. Then, in order to obtain a higher pumping speed, these may be configured in a multistage form. The first pump is large in pump size, and hence may be set outside a clean room.

On the other hand, as the second pump, for example, a momentum transfer type vacuum pump of a turbo-molecular pump, a molecular pump (a drag pump of a thread groove type, a Siegbahn type, a Gaede type, or the like), or the like is used. As the characteristics of the second pump, a pump with a high pumping speed in the high vacuum region, and with an ultimate pressure reaching high vacuum or a lower pressure than that is desirable. The momentum transfer type vacuum pump is operated at a high rotation rate so as to generally effectively apply a momentum to a gas molecule. For this reason, heat generation or a large electric power may be used for exhaust of a large flow rate gas in the medium vacuum region. Further, accordingly, the momentum transfer type vacuum pump is not suitable. According to the exhaust principle, in the medium vacuum region, the pumping speed is reduced.

Incidentally, the second pump is desirably set in the vicinity of the vacuum chamber 5 for acquiring a high vacuum performance.

Then, a description will be given to the effect of the example of the present disclosure.

In FIG. 1, in the low and medium vacuum regions (at the time of large flow rate exhaust), the bypass valve 23 is opened. At this step, the gas is exhausted through both of the passage A including the second pump therethrough and the passage B. Then, when exhaust under medium and high vacuum conditions lower than that is performed, the bypass valve 23 is closed, and exhaust is performed through the passage A.

Figure 2:
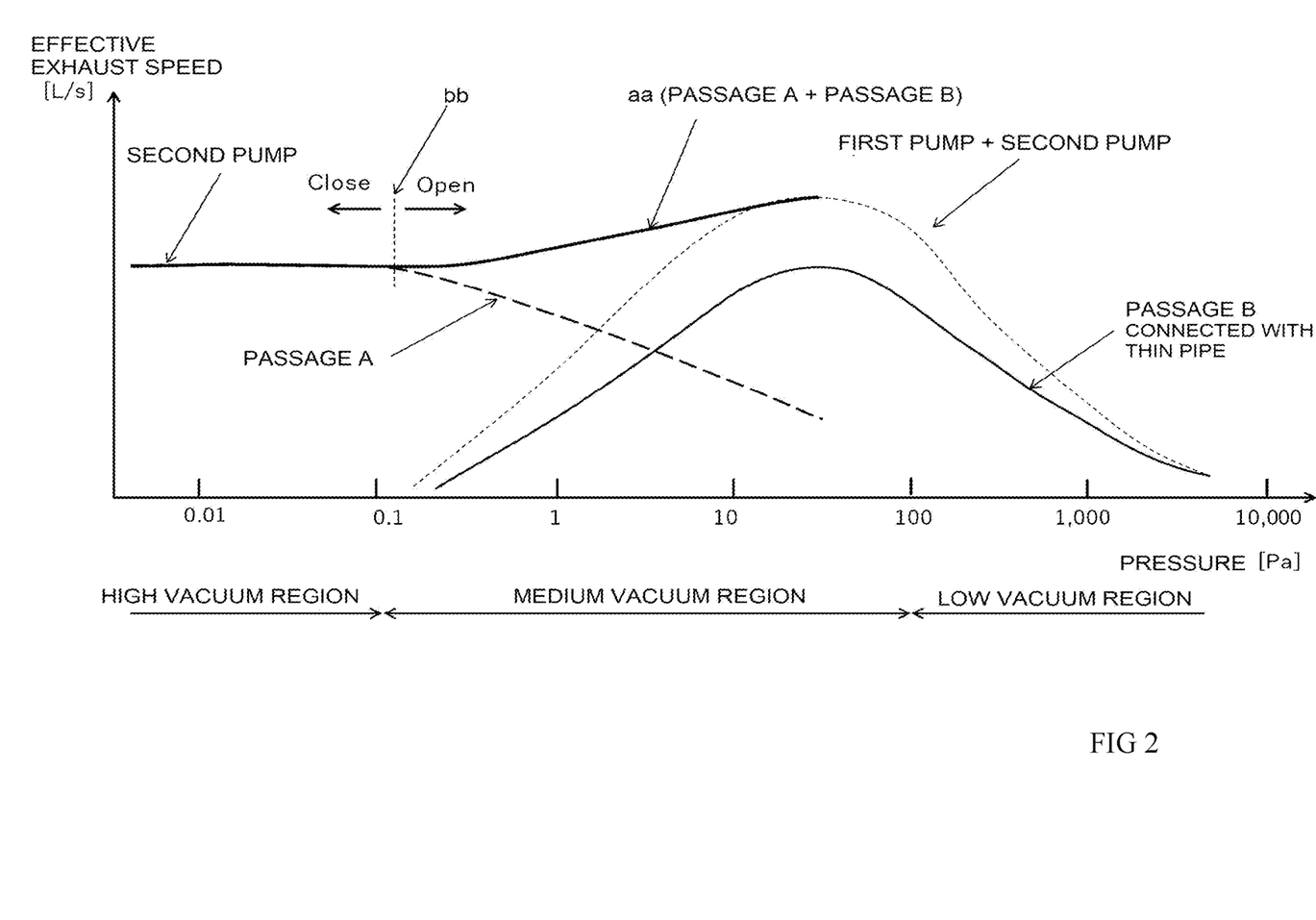
FIG. 2 is an exhaust characteristic view of the vacuum exhaust system with the configuration of FIG. 1.

FIG. 2 shows an exhaust characteristic view of the vacuum exhaust system with the configuration of FIG. 1. The passage B of FIG. 1 includes a pipe thinner than that in each case of FIGS. 3 to 5. For this reason, as indicated with a solid line in FIG. 2, the height of the mountain shape of the exhaust characteristic of the passage B is lower than that of the characteristic of the first pump of FIG. 6. However, the gas is exhausted through both of the passage A and the passage B. For this reason, the pumping speed at a point C in FIG. 1 of the merging point between the passage A and the passage B becomes roughly the total pumping speed of the passage A and the passage B. Therefore, the exhaust characteristic in the low and medium vacuum regions at the point C has the shape having the same height as that of the characteristic of the exhaust gas flowing through the passage switching valve 13 in the case of each configuration of FIGS. 3 to 4 as indicated with the mountain shape of a dotted line in FIG. 2.

Thus, the gas is exhausted through both of the passage A and the passage B. For this reason, as the exhaust characteristic of the system, the exhaust characteristic in a mountain shape indicated with a dotted line in FIG. 2 in the low and medium vacuum regions, and the exhaust characteristic that while the effective pumping speed becomes flat in the high vacuum region while attenuating in the low and medium vacuum regions on the passage A side are synthesized as with the continuous transition portion indicated with "aa" in FIG. 2.

Then, for transition from the operation in the low and medium vacuum regions to the operation in the medium and high vacuum at the position of "bb" in FIG. 2, the bypass valve 23 is switched from open to close. As a result of this, the bypass valve 23 connected with the inlet/outlet port of the second pump is blocked, so that the compression performance in high vacuum possessed by the second pump is obtained.

If in the high vacuum region, the ultimate pressure of the first vacuum pump does not reach high vacuum, when the bypass valve 23 is opened, reverse flow is caused through the passage B. For this reason, the bypass valve 23 is desirably closed. Subsequently, the second pump allows transition at a constant effective pumping speed, leading to a high vacuum state.

Incidentally, desirably, the bypass valve 23 and a gas flow rate controller 3 are interlocked, so that the bypass valve 23 is opened at the time of large flow rate, and the bypass valve 23 is closed at the time of small flow rate (or a gas flow rate of zero) requiring high vacuum. Control of opening or closing the bypass valve 23 corresponds to the opening/closing control means.

From the description up to this point, the vacuum exhaust system enables vacuum exhaust making the best use of both the exhaust characteristics of the second pump and the first pump without increasing the size of the second pump.

Incidentally, the bypass valve 23 has been described as a valve only to be opened and closed. However, with the bypass valve 23 as the valve capable of controlling the degree of opening, the degree of opening may be regulated according to the gas flow rate and the pressure in the exhaust system, thereby smoothly performing switching. Control of the degree of opening of the bypass valve 23 corresponds to the opening degree control means. Herein, the flow rate is, for example, extracted from the gas flow rate controller 3, and the pressure is extracted from the vacuum chamber 5.

With this configuration, the pressure load applied to the pump is reduced, which enables the stable operation of the pump. In addition, it is possible to prevent a fluctuation in process conditions due to the pulsation of exhaust, or the misregistration due to fluctuations in pressure or vibration of the object to be processed in the vacuum chamber 5.

From the description up to this point, the second pump, the bypass valve 23, and the pipe diameter can be reduced in size. In addition, it becomes possible to perform highly efficient exhaust making the best use of the exhaust characteristics of the first and second pumps in from high vacuum to the large flow region.

Incidentally, with the present vacuum exhaust system, first, vacuum exhaust is performed with the first pump, and the second pump is driven after the pressure in the inside thereof satisfies the operable condition. Although not shown, the inlet/outlet port of the second pump may be provided with a valve for maintenance. Alternatively, although not shown, an exhaust path and a valve for roughly evacuating the vacuum chamber 5 from the atmosphere to a prescribed pressure may be set.

Incidentally, the present disclosure can be variously modified unless it departs from the spirit of the present disclosure. The examples and respective modified examples can be variously combined.

The invention claimed is:

1. A vacuum exhaust system, comprising:
    a first pump for performing vacuum exhaust from atmospheric pressure to a medium vacuum region;
    a second pump connected in series with the first pump, and having a lower ultimate pressure than that of the first pump; and
    a bypass valve provided in parallel with the second pump via a pipe communicating with an inlet port and an outlet port of the second pump,
    wherein an exhaust gas from a vacuum chamber is exhausted via both of a passage of the second pump and a passage of the bypass valve,
    wherein in low and medium vacuum regions, while the first pump and the second pump are being operated, the bypass valve is opened, and
    wherein in medium and high vacuum regions, while the first pump and the second pump are being operated, the bypass valve is closed.

2. The vacuum exhaust system according to claim 1, comprising:
    a flow rate measuring means for measuring a flow rate of the exhaust gas flowing in the vacuum chamber; and an opening/closing control means for opening or closing the bypass valve on the basis of a magnitude of the flow rate measured by the flow rate measuring means.

3. The vacuum exhaust system according to claim 1 comprising an opening degree control means for controlling a degree of opening of the bypass valve,
wherein the degree of opening is controlled by the opening degree control means according to at least any one of a flow rate of the exhaust gas flowing in the vacuum chamber and a pressure in an exhaust system.

4. The vacuum exhaust system according to claim 1,
wherein the first pump comprises a volume transfer type vacuum pump having a high pumping speed in a medium vacuum region.

5. The vacuum exhaust system according to claim 1,
wherein the second pump comprises a momentum transfer type vacuum pump having a high pumping speed in a high vacuum region, and having an ultimate pressure reaching high vacuum or a lower pressure than the high vacuum.

* * * * *